(12) United States Patent
Cheng et al.

(10) Patent No.: US 11,939,675 B2
(45) Date of Patent: Mar. 26, 2024

(54) APPARATUS AND METHODS FOR IMPROVING THERMAL CHEMICAL VAPOR DEPOSITION (CVD) UNIFORMITY

(71) Applicant: Applied Materials, Inc., Santa Clara, CA (US)

(72) Inventors: Rui Cheng, Santa Clara, CA (US); Karthik Janakiraman, San Jose, CA (US); Zubin Huang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 597 days.

(21) Appl. No.: 16/636,659

(22) PCT Filed: Aug. 10, 2018

(86) PCT No.: PCT/US2018/046344
§ 371 (c)(1),
(2) Date: Feb. 5, 2020

(87) PCT Pub. No.: WO2019/033052
PCT Pub. Date: Feb. 14, 2019

(65) Prior Publication Data
US 2021/0147981 A1  May 20, 2021

Related U.S. Application Data

(60) Provisional application No. 62/544,507, filed on Aug. 11, 2017.

(51) Int. Cl.
*C23C 16/455* (2006.01)
*C23C 16/458* (2006.01)
*C23C 16/46* (2006.01)

(52) U.S. Cl.
CPC .... *C23C 16/45565* (2013.01); *C23C 16/4585* (2013.01); *C23C 16/46* (2013.01)

(58) Field of Classification Search
CPC ..................... C23C 16/45565; C23C 16/4585
See application file for complete search history.

(56) References Cited

U.S. PATENT DOCUMENTS 4,134,425 A * 1/1979 Gussefeld .............. B01J 8/0278
  137/625.3
5,133,284 A * 7/1992 Thomas .............. C23C 16/4583
  118/719

(Continued)

FOREIGN PATENT DOCUMENTS

CN   1359531 A   7/2002
CN   101005011 A  7/2007
(Continued)

OTHER PUBLICATIONS

International Search Report and Written Opinion for Application No. PCT/US2018/046344 dated Dec. 4, 2018.

(Continued)

*Primary Examiner* — Keath T Chen
(74) *Attorney, Agent, or Firm* — Patterson + Sheridan, LLP; Keith Taboada

(57) ABSTRACT

In one aspect, an apparatus includes a chamber body, a blocker plate for delivering process gases into a gas mixing volume, and a face plate having holes through which the mixed gas is distributed to a substrate. In another aspect, the face plate may include a first region with a recess relative to a second region. In another aspect, the blocker plate may include a plurality of regions, each region having different hole patterns/geometries and/or flow profiles. In another aspect, the apparatus may include a radiation shield disposed below a bottom of the substrate support. A shaft or stem of (Continued)

the substrate support includes holes at an upper end thereof near the substrate support.

20 Claims, 10 Drawing Sheets

(56) References Cited

U.S. PATENT DOCUMENTS

| | | | |
|---|---|---|---|
| 6,001,175 A * | 12/1999 | Maruyama | C30B 25/10 117/102 |
| 2001/0027026 A1 * | 10/2001 | Dhindsa | C23C 16/45572 438/712 |
| 2004/0094094 A1 | 5/2004 | Ohmi et al. | |
| 2008/0134974 A1 | 6/2008 | Takahashi et al. | |
| 2008/0305246 A1 | 12/2008 | Choi et al. | |
| 2012/0108066 A1 * | 5/2012 | New | C23C 16/402 438/692 |
| 2013/0126515 A1 | 5/2013 | Shero et al. | |
| 2013/0164948 A1 * | 6/2013 | Romero | H01L 21/67115 438/795 |
| 2013/0334344 A1 * | 12/2013 | Leeser | B05B 1/00 239/548 |
| 2015/0184301 A1 | 7/2015 | Saido | |
| 2016/0307752 A1 | 10/2016 | Kulshreshtha et al. | |
| 2017/0167024 A1 | 6/2017 | Wiltse et al. | |
| 2018/0030617 A1 * | 2/2018 | Kang | C23C 16/01 |

FOREIGN PATENT DOCUMENTS

| | | |
|---|---|---|
| CN | 102084461 A | 6/2011 |
| CN | 103361635 A | 10/2013 |
| CN | 106715753 A | 5/2017 |
| CN | 106906453 A | 6/2017 |
| JP | H08239295 A | 9/1996 |
| JP | 11279778 A | 10/1999 |
| JP | H11279778 A | 10/1999 |
| JP | 2002299240 A | 10/2002 |
| JP | 2012042329 A | 3/2012 |
| JP | 2012142329 A | 7/2012 |
| JP | 2012234904 A | 11/2012 |
| JP | 2017112371 A | 6/2017 |
| JP | 2002299240 A | 10/2022 |
| KR | 20030093283 A | 12/2003 |
| KR | 20110028377 A | 3/2011 |
| KR | 20120074878 A | 7/2012 |
| KR | 20150049180 A | 5/2015 |
| KR | 20170063943 A | 6/2017 |
| WO | 9949101 A1 | 9/1999 |
| WO | 2007018157 A1 | 2/2007 |
| WO | 2013163079 A1 | 10/2013 |

OTHER PUBLICATIONS

Korean Office Action dated Jan. 6, 2023 for Application No. 10-2020-7005044.

Chinese Office Action for Application No. 201880056745.6 dated Mar. 14, 2023.

Japanese Office Action for Application No. 2020-506157 dated Apr. 11, 2023.

Japanese Office Action ("Notice of Reasons for Rejection") dated Sep. 6, 2022 for Japanese Patent Application No. 2020-506157.

Korean Office Action for Application No. 10-2020-7005044 dated Jul. 1, 2023.

* cited by examiner

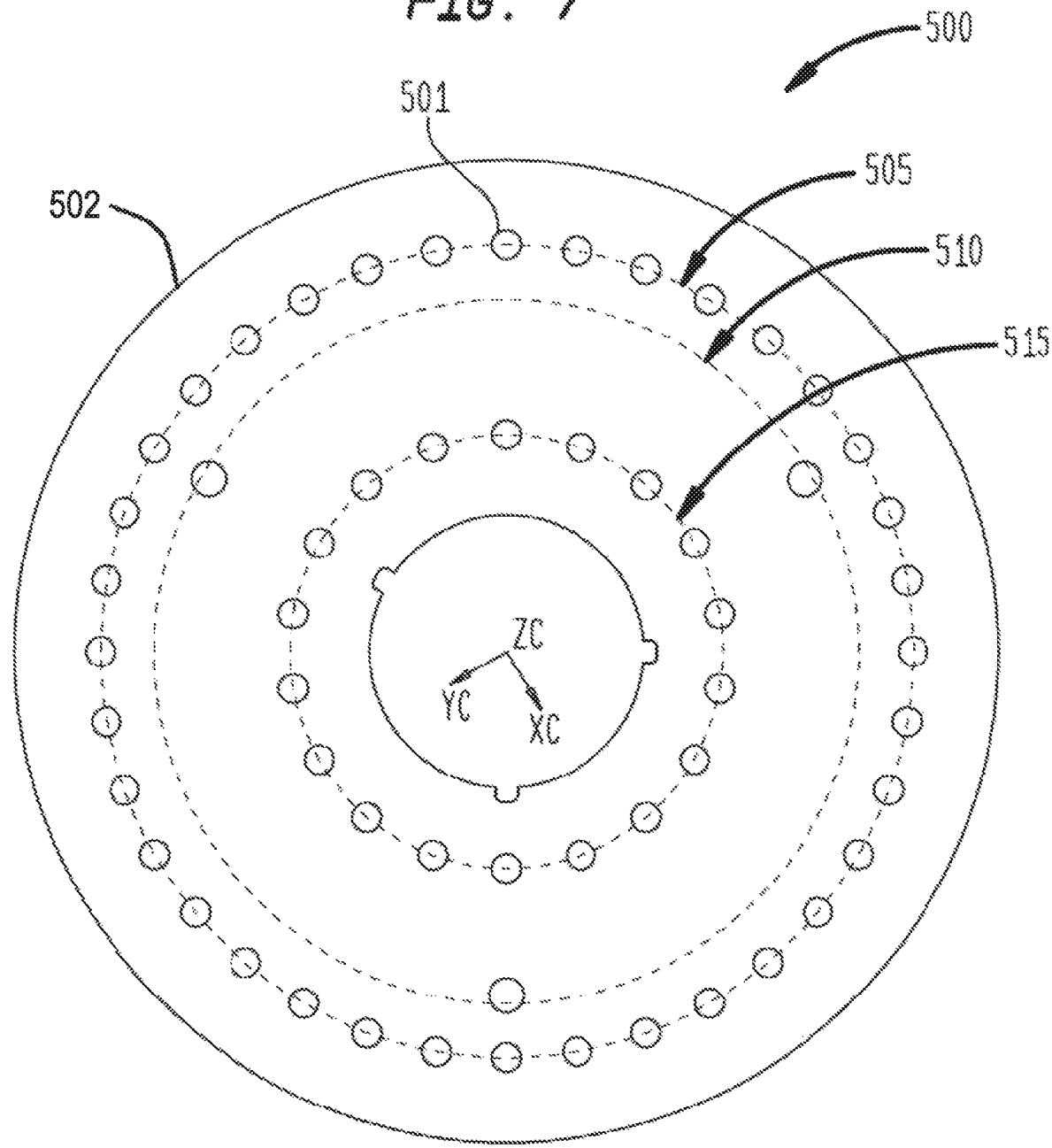

APPARATUS AND METHODS FOR IMPROVING THERMAL CHEMICAL VAPOR DEPOSITION (CVD) UNIFORMITY

BACKGROUND

Field

Aspects of the present disclosure generally relate to apparatus and methods for improving uniformity of deposition in thermal chemical vapor deposition (CVD) processes. In particular, the present disclosure provides a face plate, blocker plate, radiation shield, and substrate support assembly, and methods of using the same.

Description of the Related Art

Integrated circuits comprise multiple layers of materials deposited by various techniques, one of which is chemical vapor deposition (CVD). Non-uniformities in materials deposited on a substrate via CVD may affect device performance and may need to undergo planarization prior to further processing to reduce the likelihood of failure of the completed integrated circuit. Non-uniformities of the deposited material may result from thermal differences across a substrate.

FIG. 1 is a schematic diagram of the fluid flow in a processing chamber. This fluid flow diagram was originally disclosed in Prasad N. Gadgil, entitled "Single Wafer Processing in Stagnation Point Flow CVD Reactor: Prospects, Constraints and Reactor Design," Journal of Electronic Materials, Vol. 22, No, 2, 1993. As shown in the diagram, a gas flow pattern develops an axially uniform boundary layer across the surface of the substrate with a stagnation point at the center of the flow. A substrate support, on which the substrate is positioned, is equipped with a heater to regulate the temperature of the substrate.

In FIG. 1, $\delta_T$ indicates the thickness of a thermal boundary layer over the substrate. As the gas flows, a deposition layer grows on the substrate. The growth rate of the deposition layer is proportional to the thickness $\delta_r$ of the thermal boundary layer.

Thickness ($\delta$) of a velocity boundary layer depends on an inflow velocity, the gap between a face plate and the substrate, and a kinematic viscosity (a function of gas properties and temperature), as shown by the following equation:

$$\delta \approx 3\sqrt{v\frac{H_e}{v_{in}}\pi r^2},$$

where $v$ indicates kinematic viscosity, $H_e$ indicates a gap, and $v_{in}$ indicates an inflow velocity.

The thickness ($\delta_T$) of the thermal boundary layer is proportional to the thickness ($\delta$) of the velocity boundary layer with a Prandtl Number (Pr) (0.7 for most gases) as shown by the following equation:

$$\frac{\delta}{\delta_T} = Pr^{1/8}$$

In an ideal stagnation point flow, the boundary layer is uniform across a substrate/substrate support surface. However, non-uniformity of the temperature profile of the substrate/heater will cause non-uniformity of thin film deposition thickness. Therefore, there is a need for an improved apparatus for enhancing the uniformity of a temperature profile of a substrate and/or substrate support.

SUMMARY

In one aspect, a face plate including a body is provided. The body includes a first surface region and a second surface region surrounding the first surface region. The first surface region is recessed relative to the second surface region. A first plurality of holes is formed through the face plate in the first surface region. A second plurality of holes is formed through the face plate in the second surface region.

In another embodiment, a blocker plate including a body is provided. The body includes a first surface region and a second surface region surrounding the first surface region. The first surface region has a first emissivity and the second surface region has a second emissivity. The second emissivity is different than the first emissivity. A plurality of gas distribution holes is formed through the blocker plate in the first surface region and the second surface region. The gas distribution holes in the first surface region have a first density. The gas distribution holes in the second surface region have a second density that is different than the first density. The gas distribution holes in the first surface region have a first flow profile and the gas distribution holes in the second surface region have a second flow profile. The second flow profile is different than the first flow profile.

In yet another embodiment, an apparatus for depositing a film on a substrate is provided. The apparatus includes a chamber body and a chamber lid defining a process volume therein. A substrate support is disposed in the process volume. A blocker plate with a plurality of holes formed therethrough is disposed in the process volume opposite the substrate support. A face plate with a plurality of holes formed therethrough is disposed in the process volume between the blocker plate and the substrate support. A volume between the face plate and the blocker plate is at least partially defined by the face plate. The face plate has a first surface region and a second surface region surrounding the first surface region. The first surface region is recessed relative to the second surface region.

BRIEF DESCRIPTION OF THE DRAWINGS

So that the manner in which the above recited features of the present disclosure can be understood in detail, a more particular description of the disclosure briefly summarized above will be provided by reference to aspects, some of which are illustrated in the appended drawings. It is to be noted, however, that the appended drawings illustrate exemplary aspects and are therefore not to be considered limiting of the scope of the disclosed and claimed subject matter, and the disclosure may admit to other equally effective aspects.

FIG. 7 illustrates a radiation shield in accordance with aspects of the present disclosure.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

The present disclosure is related to a process chamber, process chamber components, and processes that provide uniform thermal profiles and uniform distribution of process gases. Aspects of the disclosure facilitate more uniform deposition profiles on substrates.

Figure 2:
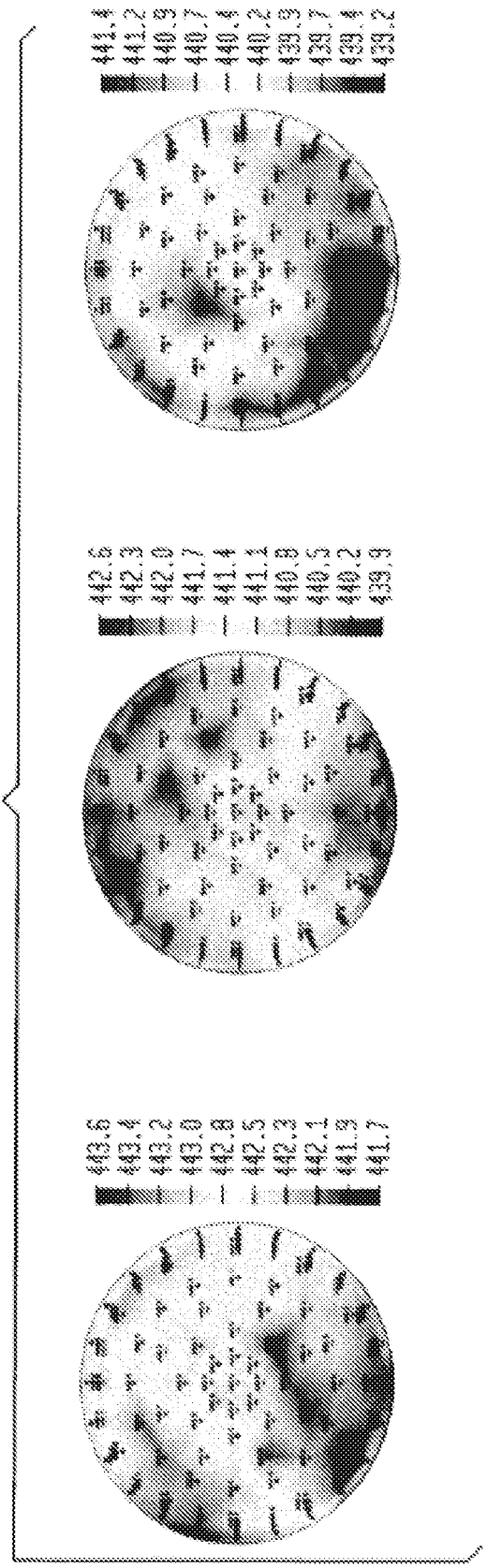
FIG. 2 illustrates example heater infrared (IR) maps of a substrate support surface.

FIG. 2 illustrates example heater infrared (IR) maps of a substrate support surface. The IR maps shown in the figures indicate that the substrate support surface has temperature variations at various locations across a surface thereof, rather than a uniform temperature profile across the surface thereof. Such temperature variations may be caused by the performance variations of heaters. The CVD process can be sensitive to processing temperatures. Additionally, temperature irregularity across the substrate support surface can cause non-uniformities of the thermal CVD process, for example, resulting in deposition non-uniformities.

The present disclosure provides an apparatus for making the temperature distribution across a surface of a substrate and substrate support surface more uniform.

Figure 3:
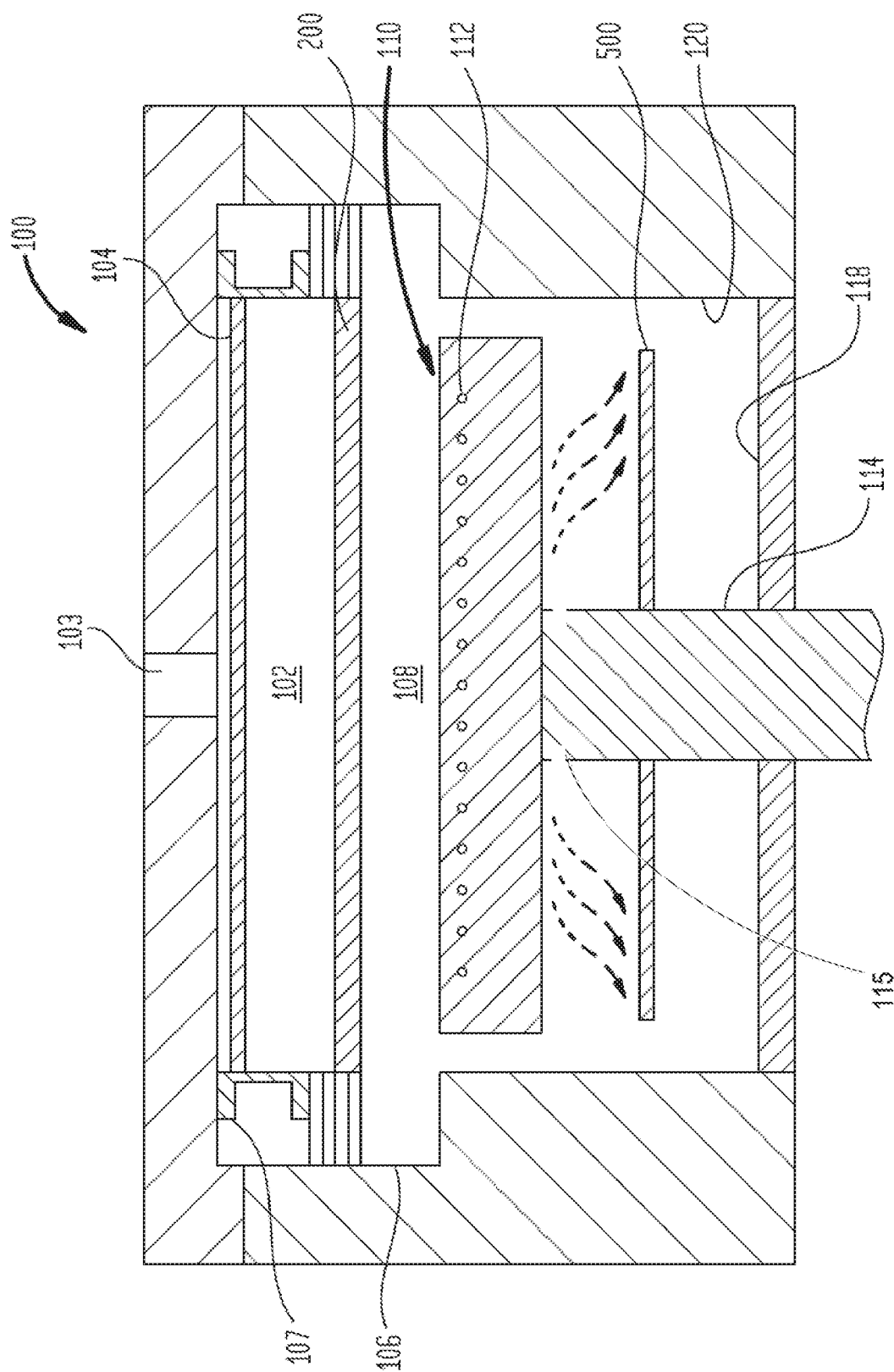
FIG. 3 is a cross sectional view of one embodiment of a CVD processing chamber including a gas distribution assembly and a substrate support assembly in accordance with the present disclosure.

FIG. 3 is a cross sectional view of an embodiment of a processing chamber 100 including a gas distribution assembly and a substrate support assembly. The processing chamber 100 includes an inlet 103 through which process gases can enter the processing chamber 100 from a gas panel (not shown), which stores process chemicals in liquid and/or gaseous form. Walls 106 of the processing chamber 100 are substantially cylindrical and define a chamber interior. However, other shapes are also contemplated. The processing chamber 100 further includes a blocker plate 104, a face plate 200, and a substrate support 110 disposed within the chamber 100.

The blocker plate 104 has a plurality of holes for delivering process gases into a gas mixing volume 102 in which the process gases mix with one another to form a mixed gas. In some embodiments, the processing chamber 100 includes two blocker plates that define a mixing volume therebetween. The blocker plate 104 is structurally supported by an adapter ring 107 at radially outward edges thereof. The gas mixing volume 102 provides a space for the process gases to mix before entering a main processing chamber volume 108.

The face plate 200 has a plurality of holes formed therethrough. The mixed gas from the gas mixing volume 102 is distributed through the plurality of holes formed in the face plate 200 to the main processing chamber 108 to facilitate material deposition on a top surface of a substrate which is supported by the substrate support 110. The main processing chamber volume 108 is positioned between a bottom side of the face plate 200 and a top surface (e.g., substrate supporting surface) of the substrate support 110. The plurality of holes formed through the face plate 200 creates a uniform gas inlet distribution for the main processing chamber volume 108.

The substrate support 110 for supporting a substrate includes a shaft 114. A base plate 118 surrounds the shaft 114 and seals an opening in a lower chamber wall 120. The substrate support 110 is equipped with a heater 112 which regulates the temperature of the substrate. In one embodiment, the heater 112 regulates a temperature of the main processing chamber volume 108 in the processing chamber 100.

In one embodiment, the processing chamber 100 includes multiple heaters each with different face plate profiles and patterns and blocker plate profiles and patterns, as described below, to improve one or more of temperature, gas flow, or deposition uniformity.

In another embodiment, the processing chamber 100 includes multiple heaters that are grouped based on temperature profiles. Each heater group compensates for a temperature profile with emissivity patterns, face plate profiles and patterns, and blocker plate profiles and patterns, as described in this disclosure.

The process gases enter the processing chamber 100 through the inlet 103. The process gases pass through the plurality of holes in a first blocker plate 104 and into a gas mixing volume 102. The process gases can include a silicon precursor(s) and/or a nitrogen precursor(s). Silicon precursors can include dichlorosilane (DOS), hexachlaradisilane (HOD), bistertiary butylaminosilane (BTBAS), silane (SiH4), disilane (Si2H6), and many others. Other process gases, and components thereof, are also contemplated.

The process gases then travel through the gas mlxmg volume 102, which is disposed below the first blocker plate 104. The first blocker plate 104 can be structurally supported by the adapter ring 107. The gas mixing volume 102 provides a space for the process gases to additionally mix prior to entering the main processing chamber volume 108.

Downstream of the gas mixing volume 102, the gases flow through the face plate 200, and enter the main processing volume 108. As noted above, the main processing volume 108 is defined by chamber walls 106, the face plate 200, and the substrate support 110, Within the main processing volume 108, the process gases thermally and/or chemically decompose to deposit a material on the surface of a substrate, Unreacted process gases, and reaction byproducts, exit the processing chamber 100 through an exhaust port (not shown). In some embodiments, the processing chamber 100 can further include gas feed inlets, a gas mixer, a plasma source, and one or more gas distribution assemblies, to facilitate processing of substrates.

Figure 4A:
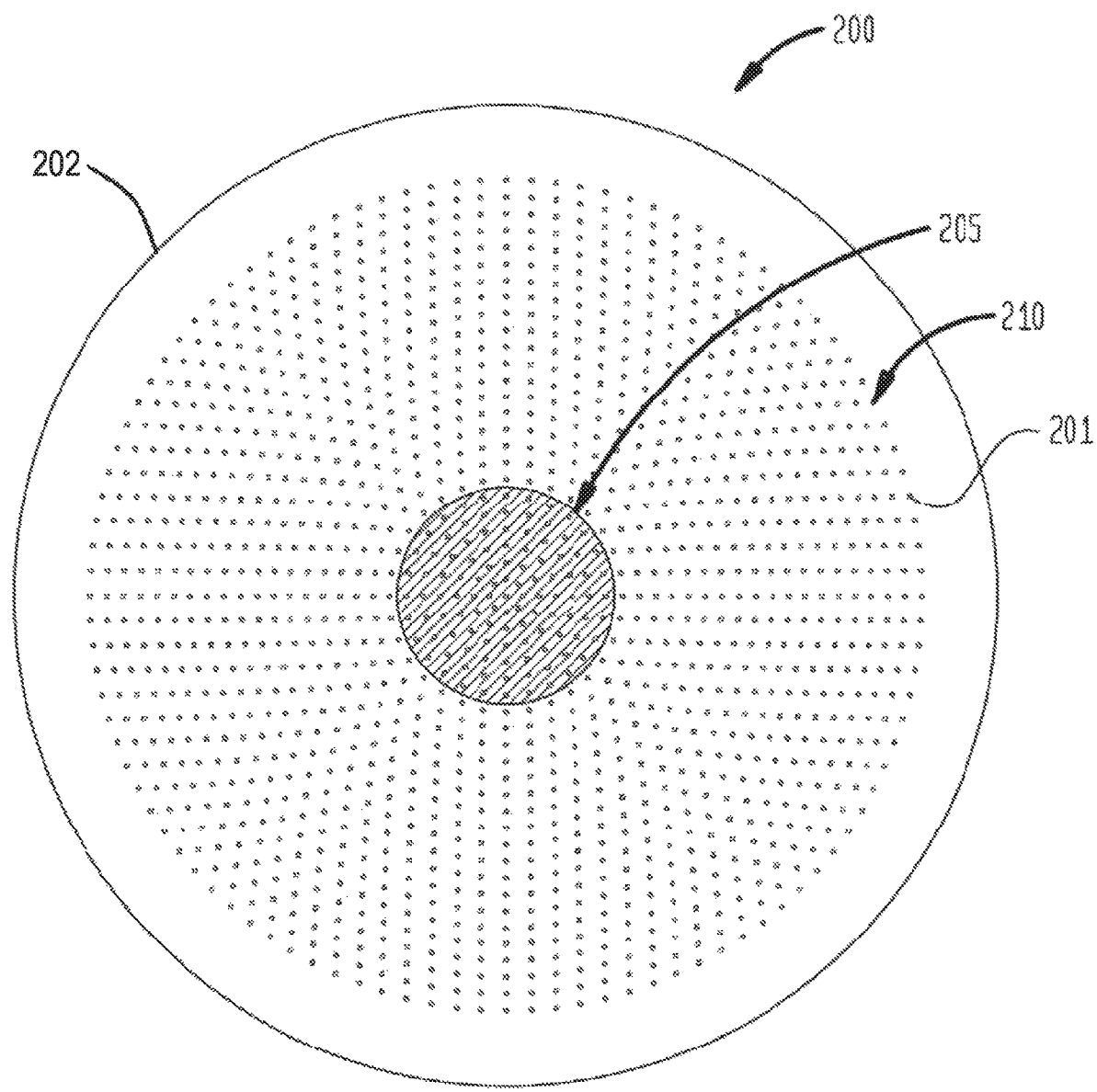
FIG. 4A illustrates one example of a face plate according to an embodiment of the present disclosure.

FIG. 4A illustrates the face plate 200 according to aspects of the present disclosure. The face plate 200 includes a body 202 having a plurality of gas distribution holes 201 formed therethrough. The gas distribution holes 201 fluidly couple the mixing volume 102 to the main processing chamber volume 108, illustrated in FIG. 3. While the body 202 is illustrated as cylindrical, other shapes, including rectangular, are contemplated. The body 202 may be formed from one or more materials such as a quartz, silicon nitride, aluminum, aluminum nitride, and stainless steel.

The face plate 200 comprises multiple regions with various emissivities on a bottom surface thereof. In one embodiment, the face plate 200 includes a first region 205 and a second region 210. The first region 205 is a central region of the face plate 200 with a first emissivity, and the second region 210 is a peripheral region surrounding the first region 205 and has a second emissivity that is different than the first emissivity. For example, the first region has a radius within a range of approximately 20% to 40% of the radius of the second region.

An emissivity of a face plate refers to an effectiveness of the face plate in emitting energy as thermal radiation. For example, a surface with a higher emissivity reflects more heat than another surface with a lower emissivity. In one embodiment, the emissivity difference between the first region and the second region is within a range of approximately 0.1% to 20%.

To obtain different emissivities, the surface of the face plate 200 can be finished (e.g., polished) with different smoothnesses or textures in different regions. The different surface finishes of the regions results in different emissivities. The different emissivities result in relative differences in the amount of heat reflected toward the surface of the substrate from each respective region. A face plate 200 having multiple regions with different emissivities allows for control of the substrate temperature at various locations on the substrate depending on the size, location, and emissivity of each region of the face plate 200. A location and size of a region on a face plate 200 and a value of emissivity of such a region can be configured to reduce temperature variations on the substrate and/or the substrate support 110. For example, a location and size of one region with a higher emissivity on the face plate 200 can be configured to correspond to a location and size of a colder area on the substrate and/or the substrate support 110. The emissivity value of the higher emissivity region can be determined depending on, and in response to, a temperature of the colder area on the substrate and/or substrate support 110. Because temperature uniformity is related to and affects the deposition rate of material on the substrate, improvement of temperature uniformity across the substrate correspondingly results in improved deposition uniformity on the substrate.

Figure 4B:
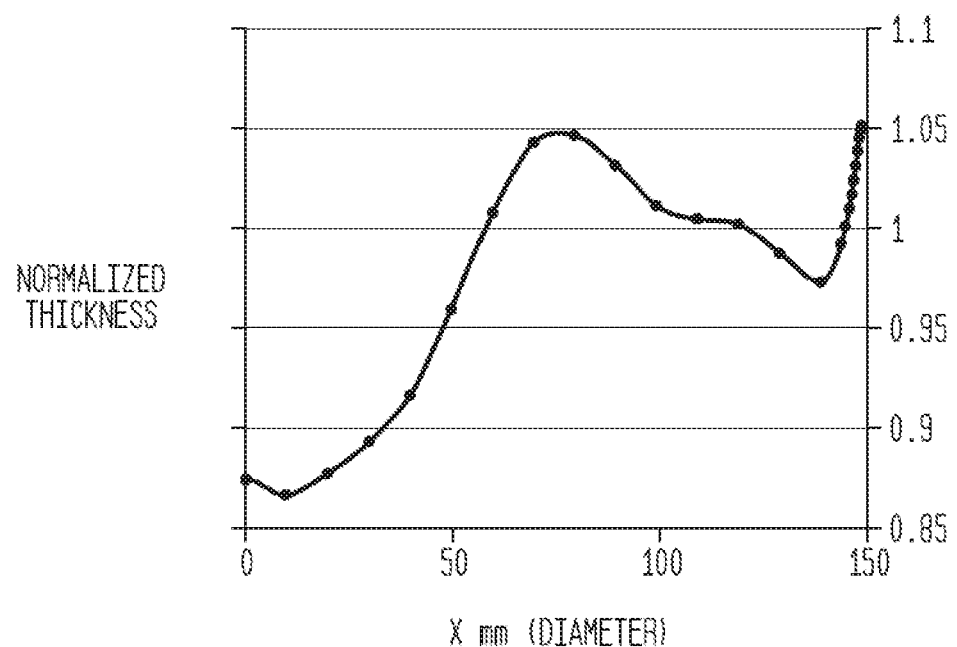
FIG. 4B illustrates one example of a diameter scan profile of a deposition layer produced from a CVD process using a conventional face plate.

FIG. 4B illustrates one example of a diameter scan profile of a deposition layer produced from a CVD process using a conventional face plate. In FIG. 4B, the horizontal axis represents a radial distance from a center of a face plate, and the vertical axis indicates a normalized thickness of a deposition layer on a substrate. The diameter scan profile using the conventional face plate shows that the normalized thickness of the deposition layer varies from approximately 0.87 to 0.95 in the center region (about 0 mm~50 mm) of a substrate.

Figure 4C:
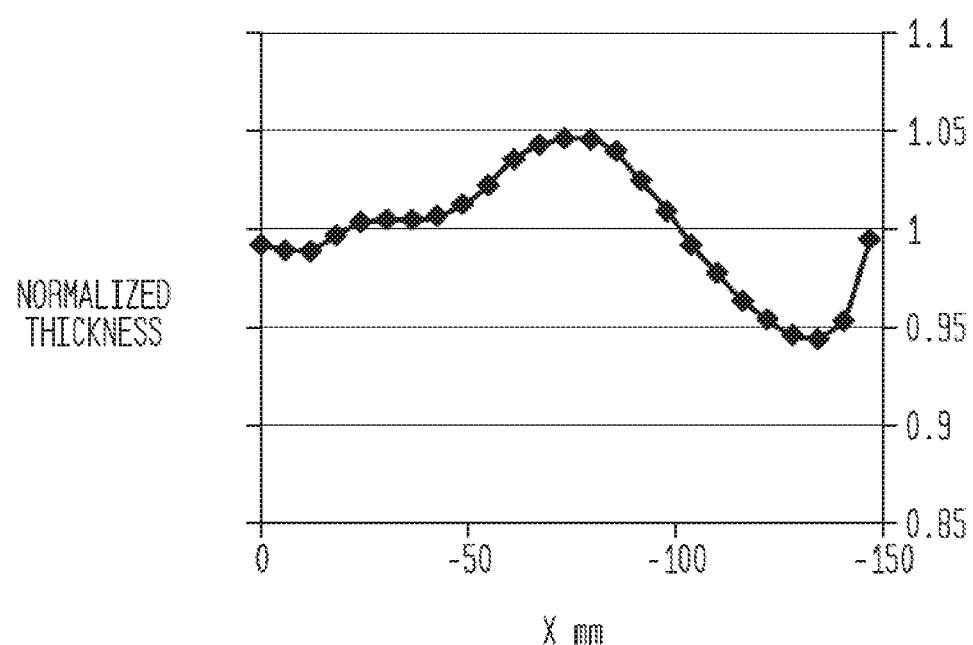
FIG. 4C illustrates one example of a diameter scan profile of a deposition layer produced from a CVD process using a face plate in accordance with aspects of the present disclosure.

FIG. 4C illustrates one example of a diameter scan profile of a deposition layer produced from a CVD process a face plate of the present disclosure, such as face plate 200 in FIG. 4A. The diameter scan profile resulting from the face plate shows that the normalized thickness of the deposition layer varies from 0.98 to 1 in the center region of a substrate.

Comparing the two scan profiles of FIGS. 4B and 4C, it can be seen that by adjusting the emissivity of the center region of the face plate, the variance of the film deposition thickness in the center region of the substrate has been significantly decreased to approximately 0.02 (1-0.98) from 0.13 (1-0.87), increasing the uniformity of the deposition layer by about 11%.

As shown above, the emissivity of different regions of the face plate can be adjusted to compensate for and improve thermal non-uniformities of the substrate and/or substrate support. Improved thermal uniformity correspondingly results in improved deposition uniformity. It is to be noted, however, that while aspects herein are described with respect to concentric regions of a face plate, it is contemplated that various other patterns or configurations of varying emissivity may be used on a lower surface of a face plate.

Figure 5A:
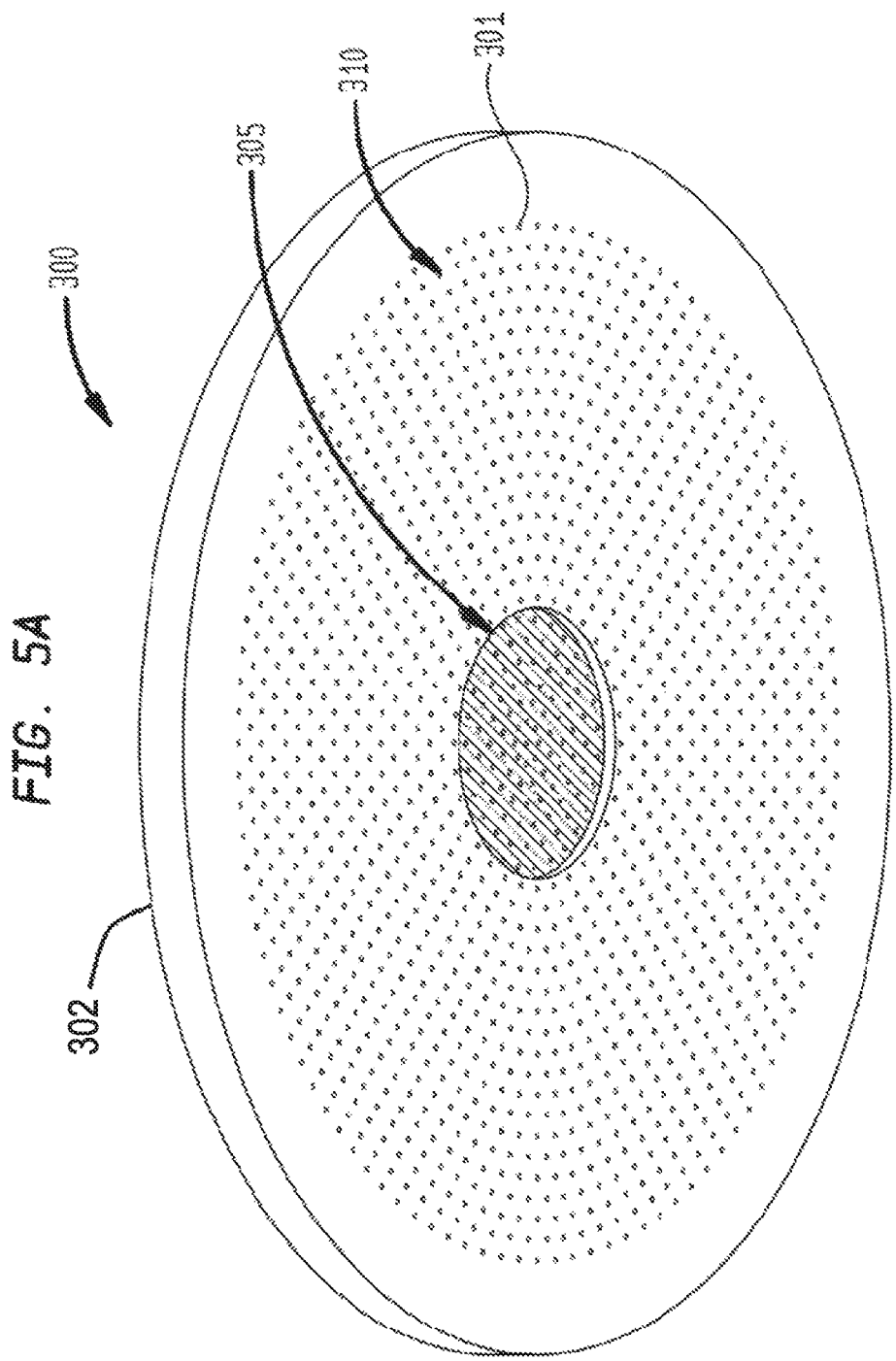
FIG. 5A illustrates another example of a face plate in accordance with aspects of the present disclosure.

FIG. 5A illustrates another example of a face plate 300 according to aspects of the present disclosure. The face plate 300 comprises a body 302 having a plurality of gas distribution holes 301 formed therethrough, which fluidly couple the gas mixing volume 102 to the main chamber processing volume 108, as illustrated in FIG. 3. While the body 302 is illustrated as cylindrical, other shapes, including rectangular, are contemplated. The body 302 may be formed from one or more materials such as a quartz, silicon nitride, aluminum, aluminum nitride, and stainless steel.

In one embodiment, the face plate 300 comprises a first region 305 and a second region 310. The face plate 300 comprises multiple regions with various thickness profiles, such that a bottom surface thereof is non-planar. For example, a difference between a thickness of a first region 305 and a thickness of a second region 310 can be within a range of approximately 5% to 45%. The first region 305 is a central region of the face plate 300 having a first thickness. The second region 310 is a peripheral region surrounding the first region 305 and having a second thickness that is different than the first thickness.

In one embodiment, the thickness of the first region 305 is less than the thickness of the second region 310. In this embodiment, the first region 305 is recessed relative to the second region 310. The recess can have various shapes including a shallow cylinder or other suitable shape for facilitating adjustment of heat reflected toward the substrate and/or substrate support 110.

The different thickness of the face plate 300 can provide a space (e.g., recess) which retains heat below the face plate 300 for a longer period of time instead of dissipating the heat. The retention of heat facilitates temperature adjustment of adjacently-positioned substrates, thus allowing for improved temperature uniformity of the substrates. Thus, the face plate 300, with multiple regions having various thicknesses, allows for control of the substrate temperature at specific areas depending on the size, location, and shape of the regions (e.g., recesses) formed on the surface of the face plate 300.

In one embodiment, the face plate 300 may comprise multiple regions with various emissivities on a bottom surface thereof. For example, the first region 305 can have a recess with a surface finish having a higher emissivity, and the second region 310 may have a surface finish having a lower emissivity. In this embodiment, the face plate 300 can provide a greater control of the substrate temperature by a combination of non-planar surface features and varied emissivities.

Figure 5B:
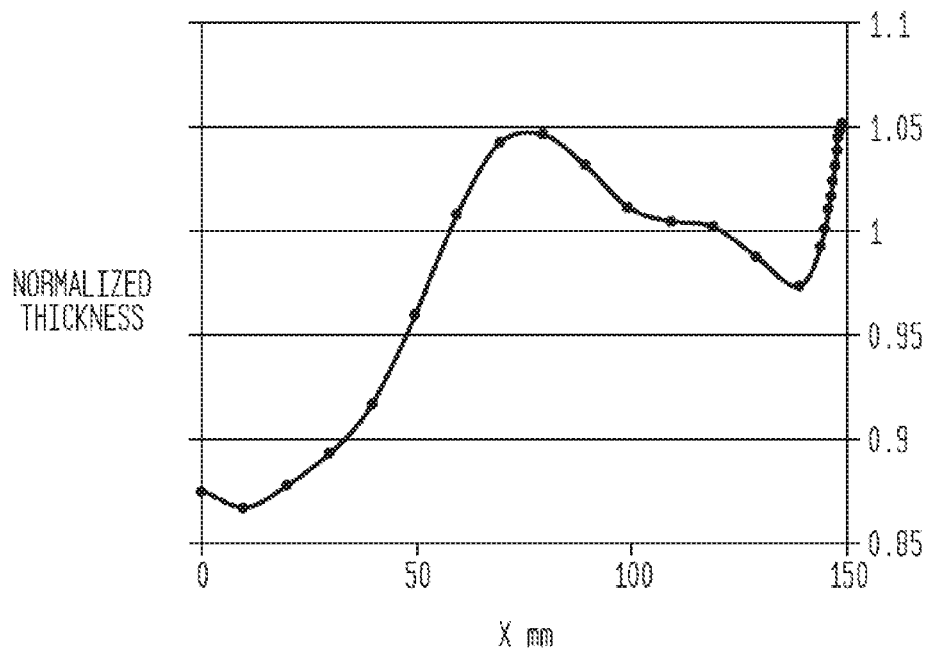
FIG. 5B illustrates one example of a diameter scan profile of a deposition layer produced from a CVD process using a conventional face plate.

FIG. 5B illustrates one example of a diameter scan profile of a deposition layer produced from a CVD process using a conventional face plate. In FIG. 5B, the horizontal axis represents a radial distance from a center of a blocker plate, and the vertical axis indicates a normalized thickness of a deposition layer on a substrate. The diameter scan profile using the conventional blocker plate shows that the normalized thickness of the deposition layer varies from approximately 0.87 to 0.95 in the center region (about 0 mm-50 mm) of a substrate.

Figure 5C:
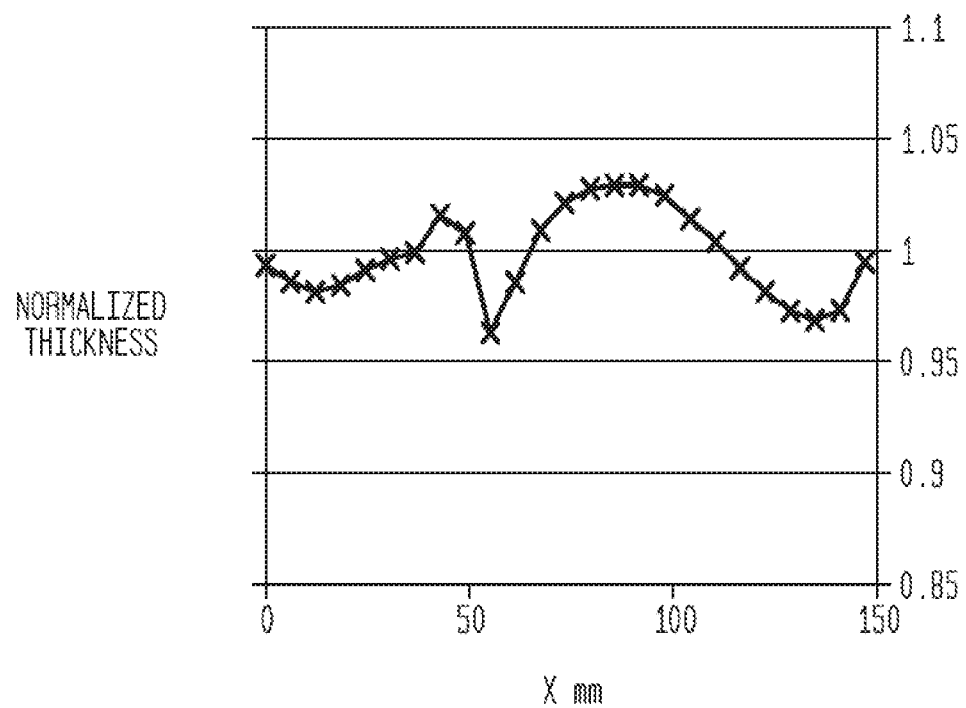
FIG. 5C illustrates one example of a diameter scan profile of a deposition layer produced from a CVD process using a face plate in accordance with aspects of the present disclosure.

FIG. 5C illustrates an exemplary diameter scan profile of a deposition layer produced from a CVD process using a face plate of the present disclosure, such as face plate 300 in FIG. 5A. The diameter scan profile resulting from the face plate 300 shows that the normalized thickness of the deposition layer varies from 0.97 to 1 in the center region of a substrate.

Comparing the two diameter scan profiles illustrated in FIGS. 5B and 5C, it can be seen that by adjusting the emissivity and/or relative position of the center region 305 of the face plate 300, the variances of the film deposition thickness in the center region of the substrate has been significantly decreased to approximately 0.03 (1-0.97) from 0.13 (1-0.87), increasing the uniformity of the deposition layer by about 10%.

Figure 1:
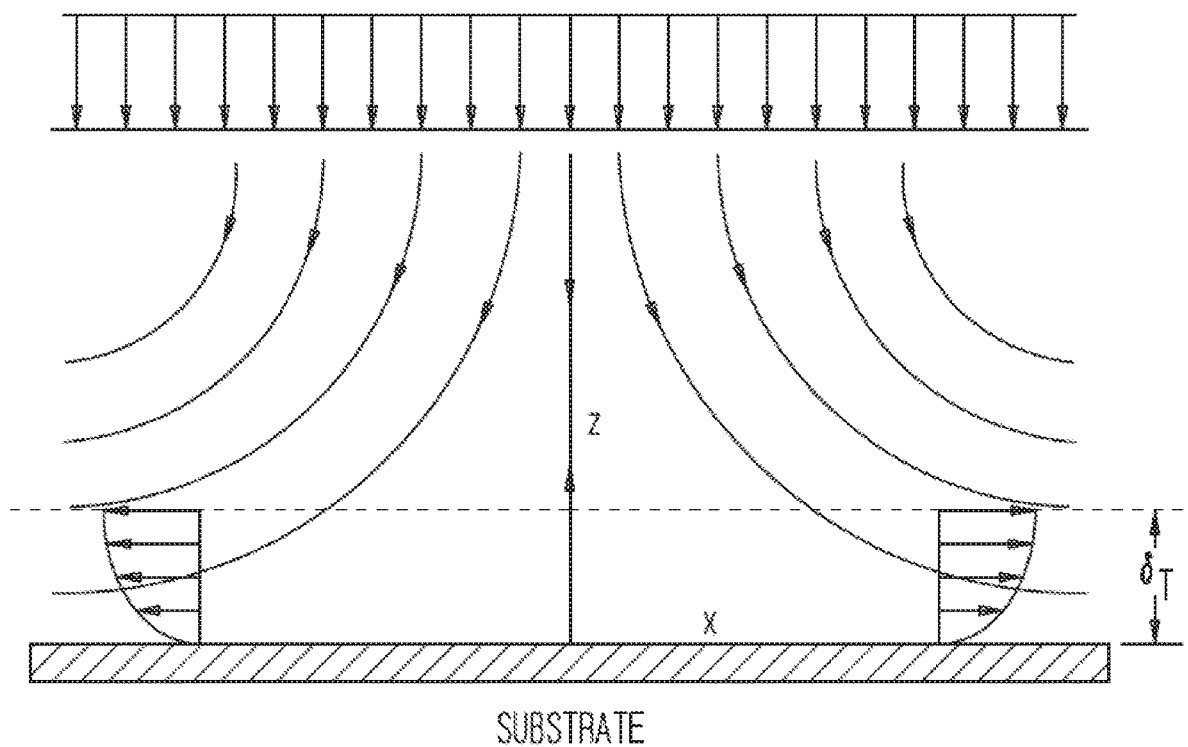
FIG. 1 is a schematic diagram of fluid flow in a processing chamber.
Figure 6A:
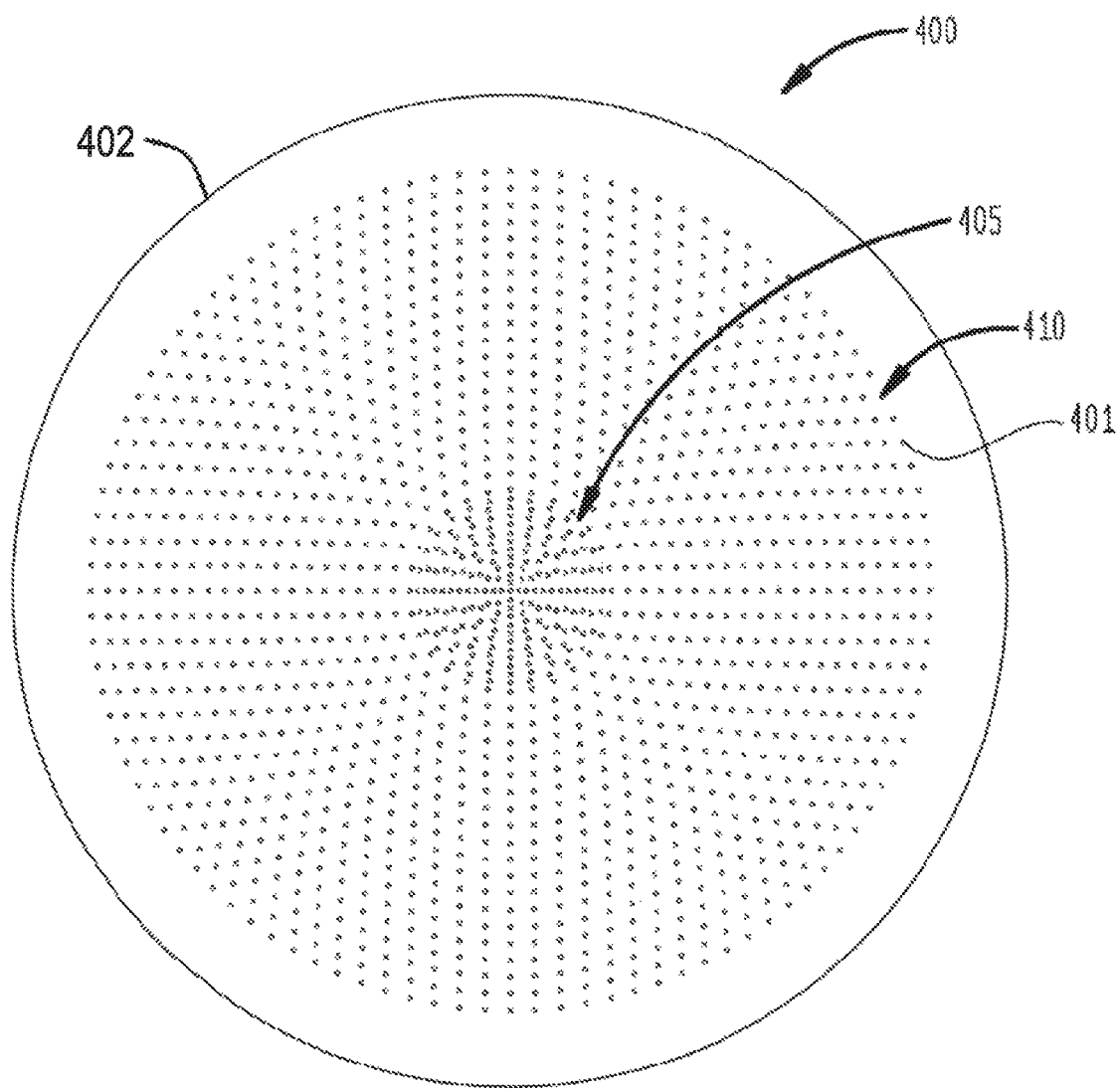
FIG. 6A illustrates a blocker plate in accordance h aspects of the present disclosure.

FIG. 6A illustrates a blocker plate 400 according to aspects of the present disclosure. The blocker plate 400 may be used in place of the blocker plate 104 of the processing chamber 100, shown in FIG. 1.

The blocker plate 400 in accordance with aspects of the present disclosure comprises a body 402 having multiple regions with various flow profiles. While the body 402 is illustrated as cylindrical, other shapes, including rectangular, are contemplated. The body 402 may be formed from one or more materials such as a quartz, silicon nitride, aluminum, aluminum nitride, and stainless steel. In one embodiment, the blocker plate 400 includes a first region 405 and a second region 410. The first region 405 is a central region of the blocker plate 400 having a first flow profile, and the second region 410 is a peripheral region surrounding the first region 405 and having a second flow profile that is different than the first flow profile.

To obtain different flow profiles, each region of the blocker plate 400 can comprise different densities and diameters of holes formed therethrough. In one embodiment, the first region 405 has a higher density of holes and the second region 410 has a lower density of holes. Alternatively, the first region 405 can have a lower density of holes and the second region 410 can have a higher density of holes. In another embodiment, the first region 405 has holes of a larger diameter and the second region 410 has holes of a smaller diameter. Alternatively, the first region 405 can have holes of a smaller diameter and the second region 410 can have holes of a larger diameter.

Generally, a higher density or a larger diameter of holes in a blocker plate produce a greater flow profile, and a lower density or smaller diameter of holes in the blocker plate produces a smaller flow profile. The increased gas flow through larger diameter holes or through more densely positioned holes results increased material deposition on a substrate in regions receiving relatively higher gas flow rates of precursor material, Thus, deposition uniformity can be improved through gas flow modulation. Likewise, increased gas flow through regions of the blocker plate may result in localized cooling of the blocker plate 400 (or face plate adjacent thereto), further facilitating deposition profile modulation.

It is contemplated that the blocker plate 400 may also include multiple regions of differing emissivity, or different relative thicknesses, in addition to the regions of differing hole size/density. Thus, temperature and deposition uniformity can be further adjusted through multiple variations across the blocker plate surface.

The blocker plate 400, with multiple regions having various flow profiles, allows for control of the substrate temperature depending on the number, size, and location of holes formed within each region. Consequently, the controlled substrate temperature improves deposition uniformity on the surface of a substrate.

Figure 6B:
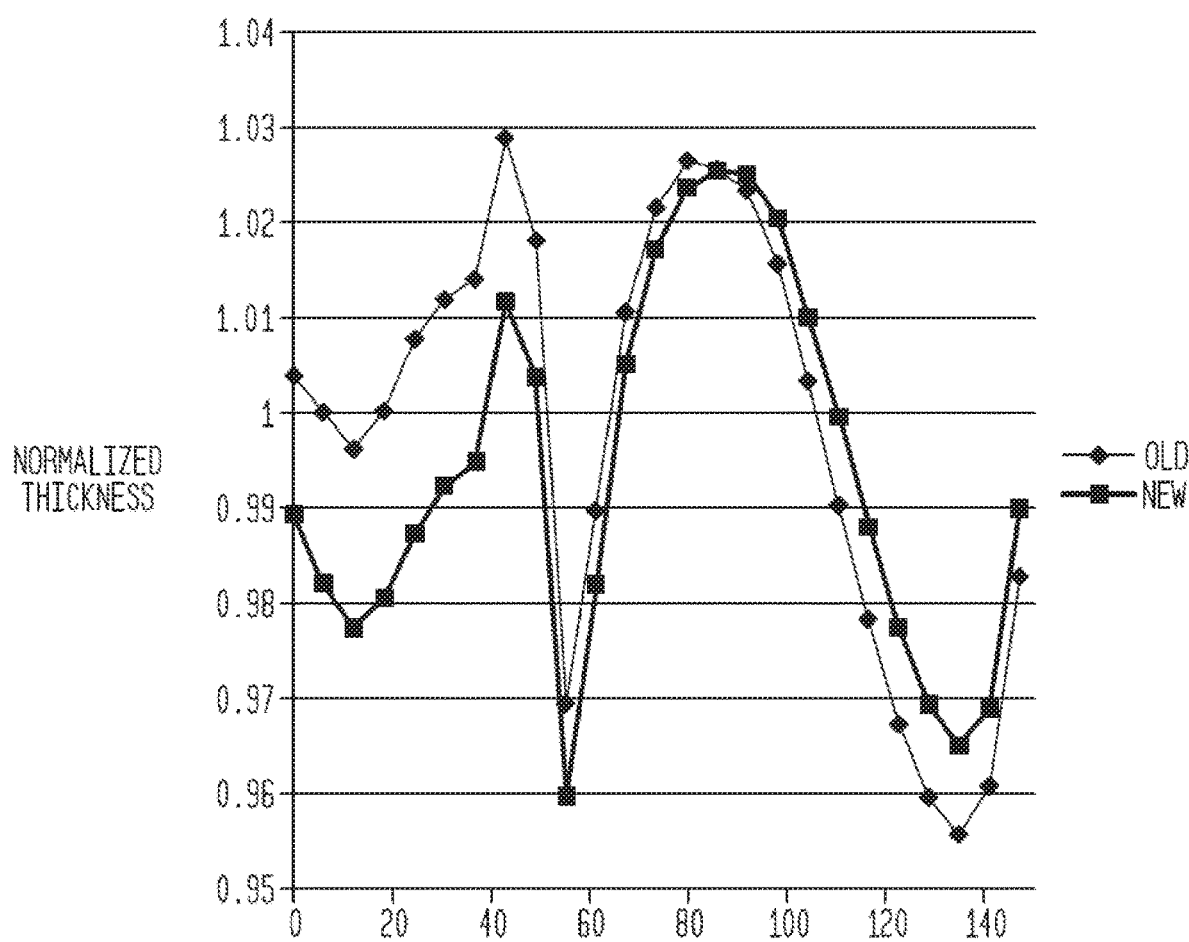
FIG. 6B illustrates two exemplary diameter scan profiles of a deposition layer, one formed using a conventional blocker plate, and the other formed using a blocker plate in accordance with aspects of the present disclosure.

FIG. 6B illustrates two exemplary diameter scan profiles, one of a deposition layer for a conventional blocker plate (i.e., old), and the other of a blocker plate according to the present disclosure, such as blocker plate 400 illustrated in FIG. 6A. Comparison of the two diameter scan profiles shows that by adjusting the flow profile of the blocker plate across a surface thereof in selected regions, it is possible to adjust film deposition thicknesses between a center region and a peripheral region.

FIG. 7 illustrates a radiation shield 500 according to embodiments of the present disclosure. The radiation shield 500 includes a body 502 having a plurality of holes 501 formed therethrough having a same or different diameters. While the body 502 is illustrated as cylindrical, other shapes, including rectangular, are contemplated. The body 502 may be formed from one or more materials such as a quartz, silicon nitride, aluminum, aluminum nitride, and stainless steel. The plurality of holes 501 can be arranged circumferentially around a common axis. The density of the holes 501 and the diameter of the holes 501 in each circumferential pattern can be different. As a result, the intervals between adjacent holes 501 are different and the flow profiles of the holes 501 are different depending on a location and a size of the holes 501.

In one embodiment, the plurality of holes 501 are disposed on three circumferential patterns 505, 510, and 515 which share a common center. The densities of the holes 501 on the circumferential patterns 505 and 515 are higher than the density of the holes 501 on the circumferential pattern 510. However, the scope of the present disclosure is not limited thereto, and any of the circumferential patterns 505, 510, or 515 can have a higher density of holes than the other circumferential patterns 505, 510, and 515. In some embodiments, the diameter of the holes 501 on the circumferential pattern 510 is greater than the diameter of the holes 501 on the circumferential patterns 505 and 515. Alternatively, the diameter of holes 501 on any circumferential pattern 505, 510, or 515 can be greater than the diameter of the holes 501 on the other circumferential patterns 505, 510, and 515.

The radiation shield 500 can have various patterns of holes 501 according to sizes, locations, and the number of holes 501. The radiation shield 500 is installed below a bottom surface of the substrate support 110. Thus, by making different patterns of holes 501 on the radiation shield 500, the radiation heat loss at the bottom surface of the substrate support 110 can be modulated to compensate for any temperature non-uniformity of the substrate support 110, and thus, a substrate positioned thereon.

In another embodiment, the shaft 114 has a plurality of holes 115 (shown in FIG. 3), for example, at an upper end of the shaft 114 near the bottom of the substrate support 110. A heat conductive gas or gas mixtures, e.g., He/H2 or Ar, can flow from the plurality of holes in the shaft of the substrate support 110 and into the main processing chamber volume 108. In some embodiments, the heat conductive gas is fed through an inner pipe of the shaft from an external gas source (not shown). With different flow rates and different gas mixtures, the convection heat loss between the substrate support 110 and the bottom heat conductive gas can modulate the temperature profile of the substrate support 110 in the radial direction.

The embodiments as described above can be used independently or in combination, to improve uniformity of thin film deposition by adjusting face plate and blocker plate properties locally. Moreover, while embodiments herein are generally described with two regions of varying emissivity, relative position, or flow density, it is contemplated that face plates and blocker plates described herein may include more than two respective regions. The inclusion of more than two regions further enhances uniformity and/or tunability.

While the foregoing is directed to aspects of the present disclosure, other and further aspects of the disclosure may be devised without departing from the basic scope thereof, and the scope thereof is determined by the claims that follow.

What is claimed:

1. A face plate, comprising:
   a body having a first surface region and a second surface region surrounding the first surface region, the first surface region recessed relative to the second surface region, the first surface region having a first emissivity and the second surface region having a second emissivity, the second emissivity different than the first emissivity;
   a first plurality of holes formed through the face plate in the first surface region; and
   a second plurality of holes formed through the face plate in the second surface region.

2. The face plate of claim 1, wherein the first surface region has a first thickness and the second surface region has a second thickness different than the first thickness.

3. The face plate of claim 1, wherein the first plurality of holes are disposed in the first surface region in a first density and the second plurality of holes are disposed in the second surface region in a second density, the second density being different than the first density.

4. The face plate of claim 1, wherein the first plurality of holes have a first diameter and the second plurality of holes have a second diameter, the second diameter being different than the first diameter.

5. The face plate of claim 3, wherein the first density is higher than the second density.

6. The face plate of claim 3, wherein the first density is lower than the second density.

7. The face plate of claim 1, wherein the first emissivity is higher than the second emissivity.

8. The face plate of claim 1, wherein the first surface region has a radius of approximately 20% to 40% of the radius of the second surface region.

9. A blocker plate, comprising:
   a body having a first surface region and a second surface region surrounding the first surface region, the first surface region having a first emissivity and the second surface region having a second emissivity, the second emissivity different than the first emissivity; and
   a plurality of gas distribution holes formed through the blocker plate in the first surface region and the second surface region, the gas distribution holes in the first surface region having a first density, the gas distribution holes in the second surface region having a second density, the second density different than the first density.

10. The blocker plate of claim 9, wherein the gas distribution holes in the first surface region have a first diameter and the gas distribution holes in the second surface region have a second diameter, the second diameter different than the first diameter, and wherein the first surface region is recessed relative to the second surface region.

11. The blocker plate of claim 9, wherein the first surface region of the blocker plate has a first thickness, and the second surface region of the blocker plate has a second thickness, the second thickness different than the first thickness.

12. The blocker plate of claim 9, wherein the first emissivity is higher than the second emissivity.

13. An apparatus for depositing a film on a substrate, comprising:
    a chamber body and a chamber lid defining a process volume therein;
    a substrate support disposed in the process volume;
    a blocker plate disposed in the process volume opposite the substrate support, the blocker plate having a plurality of holes formed therethrough; and
    a face plate having a plurality of holes formed therethrough, the face plate disposed in the process volume between the blocker plate and the substrate support, the face plate at least partially defining a volume between the face plate and the blocker plate, the face plate having a first surface region with a first emissivity and a second surface region with a second emissivity surrounding the first surface region, the first surface region recessed relative to the second surface region and the second emissivity different than the first emissivity.

14. The apparatus of claim 13, wherein the first surface region has a first thickness and the second surface region has a second thickness, the second thickness different than the first thickness.

15. The apparatus of claim 13, wherein the face plate further comprises:
    a first plurality of gas distribution holes formed through the first surface region, the first plurality of gas distribution holes having a first density, each of the first plurality of gas distribution holes having a first diameter; and
    a second plurality of gas distribution holes formed through the second surface region, the second plurality of gas distribution holes having a second density, the second density different than the first density, each of the second plurality of gas distribution holes having a second diameter, the second diameter different than the first diameter.

16. The apparatus of claim 13, further comprising:
    a radiation shield having a plurality of holes formed therethrough, the radiation shield disposed in the process volume opposite the face plate such that the substrate support is between the face plate and the radiation shield, the radiation shield disposed around a shaft of the substrate support.

17. The apparatus of claim 16, wherein the plurality of holes in the radiation shield are arranged in a first circumferential pattern, a second circumferential pattern, and a third circumferential pattern, the first circumferential pattern and second circumferential pattern having a first density of holes and the third circumferential pattern having a second density of holes, the first circumferential pattern, second circumferential pattern, and third circumferential pattern each formed around a common axis of the radiation shield.

18. The apparatus of claim 16, wherein the shaft comprises a plurality of holes formed therethrough at an upper end of the shaft adjacent to the substrate support for flowing a gas in a radial direction.

19. The apparatus of claim 13, wherein the first emissivity is higher than the second emissivity.

20. The apparatus of claim 13, wherein the first surface region has a radius of approximately 20% to 40% of the radius of the second surface region.

\* \* \* \* \*